United States Patent
Green

(12) United States Patent (10) Patent No.: US 6,219,253 B1
Green (45) Date of Patent: *Apr. 17, 2001

(54) MOLDED ELECTRONIC PACKAGE, METHOD OF PREPARATION USING BUILD UP TECHNOLOGY AND METHOD OF SHIELDING

(75) Inventor: William J. Green, Naperville, IL (US)

(73) Assignee: Elpac (USA), Inc., Naperville, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/399,848

(22) Filed: Sep. 21, 1999

Related U.S. Application Data

(63) Continuation-in-part of application No. 09/002,013, filed on Dec. 31, 1997, and a continuation-in-part of application No. 09/215,886, filed on Dec. 19, 1998.

(51) Int. Cl.[7] ...................................................... H05K 1/18
(52) U.S. Cl. .................. 361/761; 361/762; 361/763; 361/779; 174/52.1; 174/255; 174/256; 174/257; 174/260; 439/66; 439/68; 428/901; 165/185
(58) Field of Search .................................... 361/761, 762, 361/763, 779, 744, 792, 793, 810, 736, 748, 807; 174/16.3, 52.4, 52.1, 255, 256, 260, 261, 257; 439/68, 66, 74, 931; 428/901, 224; 165/185

(56) References Cited

U.S. PATENT DOCUMENTS

| | | |
|---|---|---|
| 3,192,307 | 6/1965 | Lazar . |
| 3,205,408 | 9/1965 | Boehm . |
| 4,109,296 | 8/1978 | Rostek . |
| 4,374,457 | 2/1983 | Wiech . |
| 4,495,546 | 1/1985 | Nakamura . |
| 4,602,318 | 7/1986 | Lassen . |
| 4,773,955 | 9/1988 | Mabuchi . |

(List continued on next page.)

OTHER PUBLICATIONS

"Guidelines for Molded Interconnection Devices" Oct. 1990; IPC Standard.
"In Search Of Normal Resistor Distributions" Polymore Circuit Technologies.
"Polymer Thick Film Technology" Nov. 1991; TACL Manufacturing.
"Polymer Thick Film Technology (PTF)" Aug. 1990, EB Technology.
"Polymer Thick Film" 1996; Van Nostrand Reinhold.

*Primary Examiner*—Jayprakash N. Gandhi
*Assistant Examiner*—David Foster
(74) *Attorney, Agent, or Firm*—Frederick J. Otto

(57) ABSTRACT

An improved way of preparing packaged electronic circuitry using molded plastics, Thick Film, and Build Up Technology, and achieving shielding of the circuitry and components of the package. In this invention at least one of the electronic devices in the package is supported in a molded pocket in the molded substrate, and using Build Up Technology circuit traces are added to the surface of the substrate and the electronic device, simultaneously creating the circuit traces and making the interconnections with the components at the same time. Shielding, which is optional, can easily be printed or plated over the planar surface of the packaged circuit traces and components.

23 Claims, 1 Drawing Sheet

U.S. PATENT DOCUMENTS

| | | | |
|---|---|---|---|
| 4,800,459 * | 1/1989 | Takagi et al. | 361/321.1 |
| 4,801,489 | 1/1989 | Nakagawa . | |
| 4,912,844 | 4/1990 | Parker . | |
| 4,970,354 | 11/1990 | Iwasa . | |
| 4,979,076 | 12/1990 | DiBugnara . | |
| 4,985,601 | 1/1991 | Hagner . | |
| 5,066,692 | 11/1991 | Marooka . | |
| 5,173,150 | 12/1992 | Kanaoka . | |
| 5,341,274 | 8/1994 | Nakatani . | |
| 5,371,654 * | 12/1994 | Beaman et al. | 361/744 |
| 5,376,403 | 12/1994 | Capote . | |
| 5,420,755 | 5/1995 | Hiller . | |
| 5,492,586 * | 2/1996 | Gorczyca | 156/245 |
| 5,500,789 | 3/1996 | Miller . | |
| 5,599,595 | 2/1997 | McGinley . | |
| 5,639,989 | 6/1997 | Higgins, III . | |
| 5,646,232 | 7/1997 | Marrocco . | |
| 5,652,463 * | 7/1997 | Weber et al. | 257/706 |
| 5,688,146 | 11/1997 | McGinley . | |

\* cited by examiner

MOLDED ELECTRONIC PACKAGE, METHOD OF PREPARATION USING BUILD UP TECHNOLOGY AND METHOD OF SHIELDING

This application is a continuation-in-part of U.S. application Ser. Nos. 09/002,013 filed Dec. 31, 1997, 09/215,886 filed Dec. 19, 1998.

This invention relates to the construction of a packaged electronic circuit comprising a molded-plastic support base having a capacity to accept and hold electronic devices or subassemblies thereof in a pocket within the molded substrate, and positioning them for interconnection (hereinafter referred to as "Molded Electronic Package"). The connection to the electronic devices or subassemblies is intricately formed with the placement of the circuit traces on the substrate. This is usually done at the surface level. This is an advantage over existing technology because it offers savings both in cost and space. The formation of the circuit traces by Build Up Technology is a way of creating circuitry with high precision and very fine lines. The attachment to electronic devices may also be achieved with Build Up Technology by forming the circuit traces with a plating process that simultaneously forms electrical connections to the electronic devices inserted in the pockets of a molded substrate on which the traces are formed. In some cases, there are an advantages to combining Polymer Thick Film technology and Build UP Technology when forming the circuit traces on the molded plastic containing electronic devices inserted into the molded plastic. The electronic devices may be semiconductors, integrated circuits, electromechancial devices, silicon chips, gallium arsenide chips, other active components, passive components such as Thick Film resistors or capacitors, or other devices as defined later. While molded substrates are not new, and the use of Build Up Technology and Thick Film Technology are not new, the combination of a molded substrate with a Pocket built into the molded substrate and interconnecting the electronic devices in the pocket with Build Up Technology is new and fulfills a long-felt need to be able to reserve the surface area above the trace area for other circuits traces and electronic devices. Others have tried to accomplish this by other means of interconnecting by layering circuit boards as discussed below, but only with the advent of the Build Up Technology and the new molded plastic resins which have only recently become available can we now accomplish the connecting of the electronic device in the pocket of the substrate material. The pocket permits the electronic device to be supported by the substrate instead of being supported on the trace which allows for the use of the Build Up Technology to connect the electronic devices. This long felt need to further reduce the size of circuit boards for ever smaller products while containing or reducing costs of the resulting circuits has until now been unanswered by conventional methods.

BACKGROUND OF THE INVENTION

A traditional printed circuit board comprises a supporting substrate and copper-foil circuit traces. These traces are usually formed by the chemical etching of a pattern defined onto a laminated copper surface. Sometimes both front and back sides of the substrate carry circuit traces. Two-sided, or double-sided designs usually are interconnected through vias (holes) that have copper deposited around the hole walls. A related technology exists known as Thick Film. Here the supporting substrate comprises flat, thin pieces of alumina ($Al_2O_3$) on which the traces are printed with an ink containing metal, glass frit, and other additives. When fired at the correct temperatures the ink fuses to form conductive traces to which components can be soldered. An important feature to Thick Film technology is that conductive traces can be interconnected by printed inks having specific electrical resistivity after being heated in a kiln (firing).

"Build Up Technology" is a way of creating multi-layer circuitry with high precision and very fine lines. It is therefore, like the Molded Electronic Package, a way of making things smaller. By adding multiple layers of circuit traces you can achieve more functions per unit area than can be achieved with a single layer. By using very fine traces one can achieve even more density. Traditional imaging, and the imaging processes used in the Molded Electronic Package, is screen printing where lines as fine as 0.125 mm are difficult to achieve. Build Up Technology is a known photo process, and lines in the 0.050 to 0.075 mm range are possible.

Countless variations of printed circuit boards exist, and many variations of the Build Up Technology process also exist. One application of both the printed circuit board process, and the Polymer Thick Film process is the Molded Circuit board. Here the process of converting a laminated sheet of material into the proper circuit board dimensions and having all the necessary holes, slots, and shapes are replaced by molding these features into the board. Circuit traces are applied to a board either during or after the molding process. Different methods exist for adding the electrically conductive traces to a surface. This includes such the use of Polymer Thick Film inks, sputtering, and vacuum deposition. Another method for adding the electrically conductive traces is to use Build Up Technology.

In the past the molded board with Polymer Thick Film traces (baking of the Polymer Thick Film ink creates the conductive circuit traces) found limited acceptance for a number of reasons. Printed Polymer Thick Film conductive traces have more resistance than copper foil traces. Also, electronic devices cannot be soldered to most Polymer Thick Film traces. Those electronic devices that were attached to solderable Polymer Thick Film inks did not have good adhesion to the molded substrate after the soldering process. Some Polymer Thick Film conductive inks contain lead which causes environmental concerns and which limits the ability to recycle the materials. Additionally, the molded plastic that could withstand soldering temperatures without warping were the engineering grade materials which are higher quality performing materials. These are more expensive, however, and when used, the cost advantage of the molding process is often lost. Some simple applications of the Molded Board with Polymer Thick Film traces but without components in Pockets and designed to fit into a connector have been used commercially, but in general commercial production of this type product has been limited.

Printing conductive layers over circuit board traces that are connected to and grounded by a ground plane is a known way to achieve shielding of the traces covered. The circuit traces are first sealed in an insulating layer, and then overprinted with a conductive layer. With this traditional approach it is not possible to shield the components which are attached to the circuit traces, but only the traces themselves.

Lassen's U.S. Pat. No. 4,602,318 describes achieving high density electronic networks by depositing filaments onto a substrate and encapsulating the filaments to achieve dimensional stability. Filaments are conductive or made conductive by various means. Access to these conductive traces is produced with the use of a high-energy beam to cut through and expose the filaments. Lassen claims the use of epoxy resin sheets, and polyimide resin sheets to create his circuitry.

Parker's U.S. Pat. No. 4,912,844 describes using a heated punch to define grooves and holes in a substrate. The grooves are then filled with solder to create a circuit trace which connects electronic devices.

Beaman's U.S. Pat. No. 5,371,654 describes a three dimensional electronic package with a plurality of assemblies interconnected by aligning the assemblies so they are adjacent, and interconnected by some means such as an elastomeric material, but other than a Polymer Thick Film.

Capote's U.S. Pat. No. 5,376,403 describes ink formulations which can be used to form circuit traces, but Capote does not describe or claim uses for his ink.

Hiller's U.S. Pat. No. 5,420,755 places a component in a hole cut into standard circuit board material, but does not claim using molded pockets in circuit boards. The component is attached with a standard solder connection. Placement of the component is in a cut hole and the solder joint is not different from using any common commercial solder joint to connect the electronic devices.

McGinley's U.S. Pat. No. 5,599,595 and No. 5,688,146 describes how circuit traces can be added to molded plastic to achieve a printed connector assembly. McGinley uses current technology to attach printed Polymer Thick Film conductive traces to the top surface of the Polymer Thick Film traces. McGinley uses current Polymer Thick Film methods to print resistors on the circuitry of the connector.

Marrocco's U.S. Pat. No. 5,646,231, No. 5,646,232, and No. 5,654,392 describe the use of rigid rod polymers to form a plastic molded circuit board. No mention is made as to how this is done, nor are any claims made concerning molded pockets in the substrate or attachments of the electrical devices placed in the pockets.

Nakagawa's U.S. Pat. No. 4,801,489 and Iwasa and Marooka's U.S. Pat. Nos. 5,066,692 and 4,970,354 describe how printed conductive inks can be used to create shielding properties on printed circuit boards, however all of these patents are for shielding on printed circuit boards. In my invention there is no circuit board, but rather a molded substrate containing inserted components. Also, In my invention the entire package may be shielded, and not just the circuit traces. This is a significant advantage over printed shielding that shields only the traces.

Higgins' U.S. Pat. No. 5,639,989 describes how shielding of both circuit traces and components mounted on the substrate can be achieved. Higgins patent would require applying an insulating layer over both traces and components and then applying a conductive layer over the insulating layer which connects to a ground plane. This is awkward to achieve since the surface is not planar, and these layers must be applied by spraying, dipping, pad printing, or some other method for applying a uniform thin layer to an irregular surface. In my invention the circuitry and components form a planar surface, and the layers can be easily printed with screen printing, Build Up Technology Masking or any other common commercial printing process.

Gorczyca's U.S. Pat. No. 5,492,586 discloses a construction whereby a number of semiconductor chips or bare die can be interconnected in a planar structure. Unlike the present invention, the fixing and orientation of the die is achieved by a complex operation involving forming a large well and the "potting" the chips in situ. Also, interconnection does not employ the printing of Build Up Technology.

In any case the Gorczyca device is still just another component; known as a Multi-Chip Module (MCM) albeit of complex function. The present invention enables the construction of a complete functioning system (not just a component) by placing a complete set of components both active and passive and including MCMs into precise molded pockets forming a planar structure. Gorczyka's invention is to replace the more common methods of wire bonding or "flip chipping" with plating or sputtering methods as a means of joining the semiconductor chips to the interconnection metallisation within the internal structure of the MCM. This is not relevant to the present invention since the internal structure of such a component is not a factor.

In Weber's U.S. Pat. No. 5,652,463 a transfer molded electronic package is disclosed. In Weber the novelty is that it uses passages under the heat sink to allow the molding compound in molten form to encapsulate the die and wire bonds. In the abstract Weber clearly states a pin grid array, i.e., components ready to be attached to the PCB. In Applicants invention no molten form of the molding compound is used to encapsulate the electronic device.

In Beaman's U.S. Pat. No. 5,371,654 there is a disclosure of a complicated structure for packaging electronic devices in a three dimensional structure of substantial complexity. Beaman clearly shows the need for the Applicant's invention which is a much simpler process to accomplish the same end goal of packaging electronic devices.

In Takagi's U.S. Pat. No. 4,800,459 there is disclosed an assembly which interconnects a number of components. However Takagi is ceramic and laminated and not thermoplastic and molded. The high temperature nature of Takagai precludes the use of Build Up Technology and any semiconductors. This, in effect, Takagai must be regarded as a composite or integrated component, in this case an assembly of passive devices similar to Gorczyca's assembly of active devices. Clearly, the Applicant's structure is different and more useful.

SUMMARY OF THE INVENTION

The present invention provides a cost effective, highly functional packaged electronic circuit by combining the advantages of molded substrates, Thick Film construction, and Build Up Technology in a single package. The substrate may also be vacuum formed plastic, and shielding of both circuit traces and components contained in pockets of the molded substrate may be achieved. All of these features are important developments that address the driving forces of the electronic packaging industry, and that is to create smaller and less expensive packaging alternatives. To do this I designed the molded support to accept inserted electronic devices and connecting them with additive circuitry which both adheres to the substrate and interconnects the individual components. In FIG. 1 one variation of this concept is shown. The attached electronic devices may comprise a resistor, a capacitor, an LED, or it can comprise an electromechanical device such as a connector pin or an off/on switch, or a bioelectrical functional component. It could also be bare die silicon chips, gallium arsenide chips or other chips. Other simple functional features may also be incorporated into the molded design such as heat sinks, pins that connect front-side circuitry to back-side circuitry, or thermal vias (holes or openings in the board). The electronic device in the pocket may attach on a planar level of the substrate (horizontal plane, two dimensional), or the electronic device in the pocket may attach either below or above the plane of the face of the molded substrate (three dimensional, vertical plane, in the z-axis of the substrate).

Subassemblies, which are smaller circuits complete with their own electronic devices and usually constructed on ceramic substrate, can also be attached in the same manner as electronic devices. This could include ceramic circuitry (complete with active and/or passive components). It could also include ball-grid arrays or chip scale packages. Multi-chip Modules can also be built up using molded substrates, chips inserted into pockets, and the attachment techniques defined in this document.

The traditional circuit board package begins with a substrate which supports the circuit traces while in the Molded Electronic Package the molded substrate supports both the circuit traces and the electrical devices, and the interconnection of the components is achieved by forming the circuit traces over both the electrical devices and the substrate. Connection can be directly to the electrical devices or can be through vias (small openings or holes) in an insulating layer which covers the electrical devices. In the Molded Electronic Package electronic connection can be made directly by the circuit trace formed in the Build UP Technology process or by a second material, such as a solder-paste or a conductive adhesive that is an extension of the trace.

Benefits of this construction are as follows:

1) Since the electronic device is securely held in the pocket by the molded substrate, the electronic device need no longer rely on the adhesion of the component to the circuit trace to remain secure in the circuit.

2) While the option exists to attach components to circuitry formed by Build Up Technology on molded plastic substrate, interconnection options are now available that do not require the extreme high temperatures of the soldering process. We therefore have a broader choice of molding material from which to prepare the molded substrate making possible less expensive circuitry.

3) Because electronic devices, especially resistors, can be packaged in pockets in the board in the z-axis rather than mounted to the surface of the board, valuable space is now made available for the attachment of other components. This is a very valuable feature when trying to design more compact circuitry.

4) Because a wide range of materials are available for construction of the supporting molded plastic substrate, the design engineer can take advantage of different dielectric properties such as dielectric constant, voltage breakdown resistance, and loss tangent. This only becomes possible because Molded Electronic Package packaging resolves the problems of heat sensitivity and adhesion properties as discussed above.

5) Because electronic devices such as resistors can now be mounted under the circuit traces in pockets in the molded plastic substrate rather than on top of the traces, one can now route traces to different parts of the circuit without resorting to multi layering the circuitry to avoid crossing the traces.

6) Resistor networks can now be designed below the circuit traces with a higher packaging density than possible with resistors mounted on top of traces, because the electrical connection between the trace formed by Build Up Technology and the electronic device is no longer also serving as the physical support for the electronic device, and it can therefore be a smaller, more finite joint.

7) Choices of polymer resins are available for the supporting substrate, one being Polyimide, the preferred embodiment, and also are polymers and copolymers of Epoxies, Phenolics, thermoset Polyesters, Syndotactic Polystyrene, Polyethylene Terephthalate, Polybutylene Terephthalate, Polyphenylene Sulfide, Polyamide, Liquid Crystal Polymers, Polyphenylene Oxide, Polycyclo Teretha-late and rigid rod polyphenylene. With the broad choice of polymer resins it is now possible and practical to design, build and use circuitry that can be recycled.

8) While it remains an option to use solder to attach components to circuitry formed by Build Up Technology, Molded Electronic Packages can be achieved without costly, environmental risky processes, such as the use of lead solders, which are typically used in the current printed circuit board industry.

9) The capitalization required to set up this Molded Electronic Package process is much less than for other printed circuit board factories.

10) Since molded substrates have their physical dimensions defined in the molding process they can be easily stacked in magazines for printing and baking on automated equipment. It is not practical to process traditional circuit board substrates in this way because they must be handled in large sheets to achieve economical conversion to the final size and shape. The adaptability of the Molded Electronic Package to automated handling means its user could set up manufacturing in the country of choice instead of in cheap labor markets as is common in the printed circuit board industry today.

11) Bare die in the form of silicon chips, gallium arsenide chips, or chips constructed of other semiconductor materials, can be placed into pockets and attached directly to the Molded Electronic Package board without mounting them first in one of the many carrier alternatives currently used. This not only reduces cost and saves space, but allows easy rework of faulty chips by simply removing the faulty chip from the pocket, inserting a new one, and repeating the printing process which attaches the chip.

12) Since resistors, sub assemblies, and other components can be located in the board and under the circuit traces rather than on the board and over the circuit traces, it is now possible to use an economical print process to seal both the circuitry and the components in dielectric, and overprint the package with a Polymer Thick Film conductive shielding layer.

13) Extremely low cost circuitry can be prepared from vacuum formed plastic. In this process inexpensive sheets of plastic are formed three dimensionally under heat and vacuum pressure. This inexpensive process can be used to form the pockets for inserting components, and other dimensional requirements at the same time.

BRIEF DESCRIPTION OF THE DRAWINGS

These and other objects, features and advantages of the present invention will become apparent upon further consideration of the following detailed description of the invention when read in conjunction with the figure, in which:

FIG. 1 shows the use of a solder mask to seal portions of the assembly. The solder mask is performing as an insulating protective layer. Other printed polymer dielectrics exist for this purpose that are not solder masks. Dielectrics can offer specific electrical properties such as dielectric constant, loss tangent, and voltage breakdown properties which can be important in the design of a circuit.

DETAILED DESCRIPTION

Figure 1:
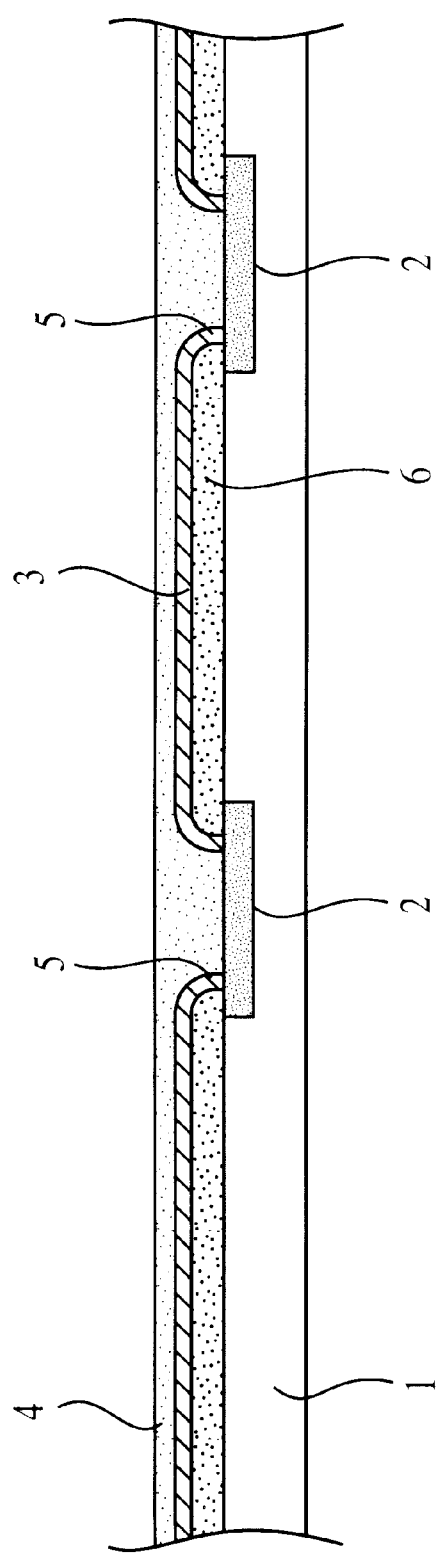
FIG. 1 shows the molded substrate 1 holding a pair of electronic components 2. The formed circuit trace 6 are a copper layer deposited with a combination of electroless copper and electrolytic copper plating, and formed so as to both produce both a conductive trace and an electrical connection 5 to the component. A layer of dielectric material 3, such as Asahi DPK-80SK-26 separates the electrically conductive copper from the molded substrate, with the electrical connection forming through vias, or holes in the dielectric layer. A solder mask 4, such as Asahi CR-20 is printed to seal the entire assembly.

The novel combination of Thick Film, Build Up Technology and plastic molding technology forms the basis of the cost savings and design advantages of this invention. The specific role of the molded substrate is to give form and support for the electric package. If the dielectric properties of the substrate become part of the function of the circuit, the role of the molded plastic is to optimize performance by providing the correct dielectric properties. In all cases the substrate provides electrical insulation between circuit traces. The role of the Thick Film is to provide passive functions, such as resistance or capacitance, within the electrical circuit. Thick Film constructions can also provide subassemblies containing active electronic devices and functions, such as transistors, diodes, integrated circuits, and other similar devices used in the packaging of electronic circuits. The function of Build Up Technology in this combination is to provide the interconnecting traces of the circuit. This fills the role served by the etched copper traces of a traditional printed circuit board. Build Up Technology can be used by itself to form circuit traces, or it can be used in combination with Polymer Thick Film technology to gain certain advantages such as cost savings.

Build Up Technology begins with a sheet of copper laminate. As with any other circuit board process the holes, slots, and dimensions of the board are made with highly precise machining on very expensive equipment. A protective coating is added of Liquid Photo Imageable mask. It is a liquid material that is printed, sprayed, curtain coated, or in some way applied over the copper laminate. Using a combination of heat, light exposure, and chemical washing an image is defined in the mask that exposes the portion of the copper that is to become the circuit traces. Traditional chemical etching is then used to create the circuit pattern in the copper layer. The remaining Liquid Photo Imageable mask is now stripped as it has served its purpose, and results in a highly precise circuit with extremely fine lines.

A film can be laminated to the copper as an alternative to printing or coating the Liquid Photo Imageable mask To this point we have only created a printed circuit board. Build Up Technology begins at this point, and it uses a variation of the photo imageable process as described above. Beginning with a printed circuit, a new Liquid Photo Imageable mask is applied. This can be printed, sprayed, or laminated. Lamination films are also available for this procedure. Many companies offer Liquid Photo Imageable inks for coating, spraying or printing. However, unlike the mask used above, this mask will be permanent, and remains as the insulating layer between adjacent vertical layers of circuitry.

To "build up" the second layer of circuitry the mask is applied and imaged. This image, however, is nothing more than select holes, or vias, through which an electrical connection is made to the first layer of circuitry.

A process is now used that is known as "electroless copper plating." The results of this process is a thin copper deposition over all surfaces. It is important to realize that while the entire surface is plated it is only connected to the circuit under the insulation layer through vias, or small holes in the dielectric layer. Later, this will provide the electrical connection between adjacent layers of circuitry.

As the deposited electroless copper is too thin for preparing circuit traces, it can be increased in thickness by continuing the copper plating in an "electrolytic bath." This is done by connecting the assembly to a voltage source and submerging in a copper plating bath. Before increasing the copper plating thickness, however, another new Liquid Photo Imageable mask is applied that is similar to the first one used. Again, it is a temporary mask that will be stripped away at the end of the process. However, instead of protecting the copper that is to remain after etching, it exposes the copper that is to remain as the second layer circuit trace, and protects the copper that is removed. Now, when placing this assembly in the electrolytic copper bath, the plating thickness is achieved, the temporary mask is stripped away, and a mild chemical etching of the copper is repeated. This is a brief chemical exposure where thin copper deposits are easily stripped away, and the thicker ones remain.

The results of this entire process is two layers of circuitry, each formed by a highly precise photo process, and separated by a insulating layer that is also highly precise and formed by a photo process. The connection between the two layers is through the holes, or vias in the insulating layer. These can also be extremely small, thus making possible a highly functional circuit in a very small area. Once again, smaller and smaller is one of the driving forces of the industry. This process can now be repeated over and over. A permanent insulating layer is used with vias for connection between adjacent vertical layers of circuitry, a thin copper layer is formed on the surface, a temporary mask applied and imaged, selected copper thickness is deposited, and both the thin copper and the temporary mask are stripped away in separate process that leaves a new layer of circuitry connected to the layer of circuitry directly beneath it. In this way, many layers of precise circuitry can be "built up" in a small unit area. Thus the name, "Build Up Technology."

While Build Up Technology serves to provide fine traces and layers of circuitry with micro-connections between layers, it is still limited with a structural restriction. Only the top layer of circuitry can be used on which to place components. Several processes exist that will produce resistance and capacitance in thin layers, and studies are underway to incorporate placing these "passive" functions in the inner layers of multilayer construction, thus leaving more room on the top surface for other components. These processes, however, are expensive and limited in performance range.

Now, the Molded Electronic Package serves a dual purpose. In current Build Up Technology adjacent layers of circuitry are separated from each other with a permanent mask and connected to each other with vias, holes, in that mask. With the Molded Electronic Package one can place components in pockets of a molded substrate, and Build Up Technology can be used to connect to the components underneath the first layer of circuitry. This leaves the entire top surface open for mounting whatever components are not first placed in the molded pockets. And the combination of technologies permits more advantages.

While current research would be content to place the passive components in the inner layers of a multi-layered circuit, Molded Electronic Package technology could place both active and passive components in the pocket layer. These electronic devices would include both packaged chips and bare chips.

The components placed in the pockets can be ceramic resistor arrays, and therefore require less space than a combination of surface mounted components.

The passive components placed in the pockets can be of equal quality to surface mount components, and cover the full resistance and capacitance range.

Connections to the inserted components can be microvias, just as the connections between layers of circuitry, and therefore smaller than landing pads used to surface mount components.

The components placed in pockets can be thin, multilayered or two sided sub-circuits, thus achieving an even higher packaging density.

In addition there are a number of cost advantages associated with Molded Electronic Package constructions. It is often found that both a cost savings and a size reduction can be achieved by designing a Molded Electronic Package compared to a traditional package. This will apply to Build Up Technology as well.

The Build Up Technology circuit traces are deposited normally by using masking techniques known in the industry and described above. The metal deposited in the plating process will provide the conductivity while the temporary masking only defines the image to selectively accept metal plating.

Polymer Thick Film materials can also provide other functions within the circuitry, such as resistance, capacitance, and dielectric separation between layers of a multilayer construction. These functions can be part of the total construction, but are not novel to this invention. It is the interconnection of the electronic devices that are held within the molded frame that is an improvement over existing technology.

Because the circuitry and the components are constructed to have a common planar surface it is now possible to seal this surface with a insulating layer, or dielectric layer, and then cover the entire surface (or any portion thereof) with a conductive layer that is grounded. In this way shielding of the circuit is complete. Both components and circuit traces are enclosed in the same shielding envelope. This is not economically possible when the components are soldered to the surface of a printed circuit board, or attached with wire leads. Shielding of electronic packages is becoming more and more important, and this technology is best suited for being prepared with an inexpensive printed or plated conductive layer.

Throughout this description electronic device is defined as a passive component which serves a function within the circuit such as a resistor or capacitor, or an active component such as a transistor or a diode or an integrated circuit, or a semiconductor, or a multichip Module, or a silicon chip both bear die and mounted chips, or gallium arsenide chips, both bear dies and mounted chips and other chips. An electronic device can also be a plastic ball grid array or a chip scale package, or a subassembly of circuitry and components. An electronic device can also be an electro-mechanical device such as a connector pin or an off/on switch, or a bioelectrical component.

Throughout this description Thick Film is defined as that process for preparing electronics circuitry that uses ceramic materials in the ink formulations in contrast to Polymer Thick Film where the ink formulas are based on polymer materials.

Throughout this description a molded substrate is defined as a support for an electronic circuit molded from any available plastic resin suitable for the purpose such as Polyether Imide which is preferred for its combination of low cost, ability to withstand high temperature exposures as experienced in a commercial soldering process, ability to mold flat, remain flat throughout subsequent processing, and its formation of strong adhesive bonding with most Polymer Thick Film inks. Other plastics that can be used to construct molded substrates include, but are not limited to Epoxies, Phenolics, thermoset Polyesters, Polyethylene Terephthlate, Polybutylene Terephahlate, Polyphenlyene Sulfide, Polyamide polymers and copolymers, Liquid Crystal Polymers, Polyphenlyene Oxide, Polycyclo Terethalate, Syndotactic Polystyrene, and rigid rod Polyphenylenes. In the examples given in this description a specific size is given for the pocket and the electronic device inserted into the pocket. This is a practical and convenient size, both for an example and for actual assembly, however the specific size is given for example only, and an infinite number of sizes could be used.

Throughout this description a Polymer Thick Film conductor ink is defined as any ink, screen printed, pad printed, or printed with any other commercial process which deposits material that upon processing will conduct electricity with a resistivity low enough for the print to serve as a conductive trace in an electronic circuit. This is normally less than one tenth of an ohm per square in sheet resistance as printed. Examples of Polymer Thick Film conductor inks are Asahi LS 504J Silver, Asahi LS 506J Silver, Asahi Copper CU-051, and Grace 4001 Silver.

Throughout this description a fusible Polymer Thick Film conductive ink is defined as an ink which contains metal fillers which upon processing melt and solidify in a manner similar to solder reflowing, and which upon processing form an adhesive bond to the supporting substrate. Such inks usually have low resistivity and are capable of accepting solder to form a solder joint between a conductive trace and a electronic device. Examples of fusible conductor inks are SVT EU 1328, Kester Ormet 1200, and Kester Ormet 2005.

Throughout this description the term Build Up Technology, also known as Sequential Build Technology, is defined as any process where deposited layers of conductive materials such as metal and dielectric materials are formed in alternate layers and interconnected through holes, or vias, in the dielectric layer. A more complete explanation is discussed throughout this patent.

Throughout this description the term bare die is defined as any semiconductor material in the form of an active component that is not packaged in a carrier of any type. The semiconductor material can be silicon, gallium arsenide, and any other semiconductor material capable of performing as an active component. It may include solder bumps for ease of assembly, any other pre-assembly preparation, or unprepared in any way.

Another variation of this invention is that of an active electronic device, such as a silicon chip, integrated circuit, or semiconductor, can be connected in the circuit in any of the processes shown in FIG. 1.

Another variation of this invention is that of one or more active electronic devices, such as a silicon chips, integrated circuit, or semiconductors, that are connected in the circuit while in the form of a bare die using any of the processes shown in FIG. 1.

Another variation of this invention is that of one or more active electronic devices, such as a silicon chips, integrated circuits, or semiconductors, that are connected in the circuit while in the form of packaged components using any of the processes shown in FIG. 1.

Another variation of this invention is when the dielectric material is applied by any commercial process such as screen printing, spraying, dipping, electrostatic deposition or laminating, to complete a structure as shown in FIG. 1.

Another variation of this invention is when the conductive traces and dielectric material are applied alternatively and vertically interconnected to form a multilayer structure.

Another variation of this invention is when the conductive traces and dielectric layers are formed using the many variations of Build Up Technology, Sequential Build Up and microvia techniques, materials and processes know to those skilled in the art.

Another variation of this invention is using a subassembly, such as ceramic circuit to which other components are, or can be, attached.

Another variation of this invention is when the electronic devices made on separate plastic moldings are inserted into the Molded Electronic Package in place of the Thick Film components or sub assemblies.

Another variation of this invention is when electronic devices made on printed circuit board materials such as FR4, FR2, CEM1, CEM3, and polyimide laminate are inserted into the Molded Electronic Package in place of the Thick Film electronic devices or sub assemblies.

Another variation of this invention is when a dielectric material is used to seal the entire package, or a portion thereof, and a Polymer Thick Film conductive material is used to shield the circuit traces and the inserted components.

Example 1. A substrate is molded of a preferred material commonly called Polyether Imide, but may be molded from such materials as but not limited to Polyethylene Terephthalate, Polybutylene Terephthalate, Polyphenylene Sulfide, Polyamide, Liquid Crystal Polymers, Polyphenylene Oxide, Polycyclo Terethalate, thermoset Epoxies, thermoset polyester, thermoset Phenolic, syndotactic polystyrene or a rigid rod polyphenylenes. The molded substrate contains a pocket 0.5 cm by 1.25 cm and 0.05 cm deep. A ceramic substrate of the same or slightly smaller dimensions on which is printed a resistor array is placed in this pocket. The surface of this assembly is sealed with a liquid photoimagible dielectric which is screen printed and processed to leave vias, or holes, through which electrical connections can be made. Copper circuit traces are formed on the molded substrate using Build Up Technology. The circuit traces terminate directly on the terminal sites of the electronic device, and in this way attachment is achieved. This attachment is simultaneous with the formation of the circuit on the substrate. Attached components are those that are electrically connected and physically secured. The surface is now sealed again with a solder mask such as Asahi CR-20. The circuit traces terminate directly on the terminal sites of the electronic device, and in this way attachment of the electronic device is achieved. This attachment is simultaneous with the formation of the circuit on the substrate.

Example 2. A substrate is molded of a suitable material, fitted with an electronic device inserted into a molded pocket, and connected with copper circuitry using Build Up Technology as described in Example 1. Above the layer of copper circuit traces another layer of photoimagible dielectric is printed that has vias which allow for electrical connection to the these circuit traces. This second layer of circuitry is then sealed with a solder mask such as CR-20. The circuit traces terminate directly on the terminal sites of the electronic device, and in this way attachment of the electronic device is achieved. This attachment is simultaneous with the formation of the circuit on the substrate.

Example 3. A substrate is molded of a suitable material, fitted with an electronic device inserted into a molded pocket, connected with copper circuit traces using Build Up Technology, and overlaid with a second layer of photoimagible dielectric as described in Example 2. A second layer of circuit traces is them formed using Polymer Thick Film materials such as Asahi LS 506 J Silver Conductor, a copper ink that accept copper plating to become electrically conductive such as Ashai ACP - 007P - 2, or a fusible Polymer Thick Film ink such as Multicore Polymet. This second layer of circuitry is then sealed with a solder mask such as CR-20. The circuit traces terminate directly on the terminal sites of the electronic device, and in this way attachment of the electronic device is achieved. This attachment is simultaneous with the formation of the circuit on the substrate.

Example 4. A substrate is molded of a material such as described in Example 1 and fitted with an electronic device in the molded pocket as in Example 1. Circuit traces are printed on the molded substrate with multiple layers of Build Up Technology traces The circuit traces terminate next to but not entirely cover the terminal sites of the electronic device. Attachment of the electronic device is achieved by applying and reflowing a solder paste such as Multicore WS 12AAS88.

Example 5. An alternative to Example 4 is to make the attachment with a conductive adhesive such as Multicore –4030 Ag/TP or an fusible ink such as SVT EU 1328. The process for curing the conductive adhesive is to apply the material and bake it in a box oven for 30 minutes at 140 degrees C.

Example 6. A substrate is molded of a material such as described in Example 1, and fitted with an electronic device in a molded packet as described in Example 1. The assembly is overprinted with a photoimagible dielectric which has vias to expose the termination site of the inserted component. Circuit traces are formed on the molded substrate with Build Up Technology. This layer is sealed with a second layer of photoimagible dielectric wit vias, or holes, to allow for electrical connections to be made to the copper circuit traces below the dielectric. A second layer of circuitry is then printed using a Polymer Thick Film material such as Multicore Polymet. A surface mount component such as a resistor is also placed onto the circuit while the ink is still wet. The assembly is then reflowed in a hot vapor furnace at 215° C. for 5 minutes. The circuit traces terminate directly on the terminal sites of the electronic devices, and in this way attachment is achieved upon reflow of the ink. This attachment is simultaneous with the formation of the circuit on the substrate.

Example 7. In examples 1–7 the components have termination sites to which attachments are made, but they do not have leads (metal wires or flat metal extensions from the termination sites). Any of the electronic devices in examples 1–7 that can be acquired as leaded components are assembled in this example by mounting them in molded pockets that support the device and its leads so that one is able to interconnect the leads of the device using the multi layered Build Up Technology described in examples 1–7.

Example 8. A substrate is molded of a material such as described in Example 1 and fitted with a bare chip. Circuit traces are printed with multi layered Build Up Technology that connect to the chip as in Examples 1 through 7 to form a smart card.

While the present invention has been described with respect to preferred embodiments, numerous modifications, changes, and improvements will occur to one skilled in the art without departing from the spirit and scope of the invention.

What is claimed is:

1. An electronic package structure comprising:
   a molded substrate having first and second opposing surfaces, and an electronic device disposed on one of the said surfaces: said molded substrate having a molded pocket on one of said opposing surfaces into which said electronic device is supported in said pocket;

wherein said electronic device is connected via copper traces formed using Build Up Technology on the surface of said molded substrate and exposed surface of the electronic device contained in the molded pocket.

2. The structure of claim 1, wherein the said electronic device inserted into a molded pocket is a bare die which is inserted in said molded pocket without first mounting in a carrier of any type.

3. The structure of claim 1, wherein the electrically conductive circuitry is formed by a combination of Build Up Technology and Polymer Thick Film technology.

4. The structure of claim 1, wherein the said electronic device which is inserted into a molded pocket is a die contained in a carrier to form a packaged component.

5. The structure of claim 1, wherein a dielectric layer is applied over the components supported in said pocket and over the said conductive traces by spraying.

6. The structure of claim 1, wherein a dielectric layer is applied over the components supported in said pocket and over the said conductive traces by dipping.

7. The structure of claim 1, wherein a dielectric layer is applied over the components supported in said pocket and over said conductive traces by laminating.

8. The structure of claim 1, wherein the conductive traces are formed over the first molded substrate surface and the component connection sites on the first substrate surface by electrolytic plating.

9. The structure of claim 1, wherein the conductive traces are formed over the first molded substrate surface and the component connection sites on the first substrate surface by electroless plating.

10. The structure of claim 1, wherein the conductive traces are formed over the first molded substrate surface and the component connection sites on the first substrate surface by any combination of electroless and electrolytic plating.

11. The structure of claim 1, wherein the conductive traces are formed over the first molded substrate surface and the component connection sites on the first substrate surface by sputtering.

12. The structure of claim 1, wherein the conductive traces are formed over the first molded substrate surface and the component connection sites on the first substrate surface by vacuum deposition.

13. The structure of claim 1, wherein the conductive traces are formed over the first molded substrate surface and the component connection sites on the first substrate surface by any form of laminating.

14. The structure of claim 1, wherein said electronic device is an integrated circuit.

15. The structure of claim 1, wherein said electronic device is an active component.

16. The structure of claim 1, wherein said electronic device is a passive component.

17. The structure of claim 1, wherein conductive traces and dielectric layers are alternately applied using Build Up Technology to form a multilayer structure.

18. The structure of claim 1, wherein conductive traces, dielectric layers and vertical interconnects are formed using Build Up Technology and microvia techniques in combination.

19. The structure of claim 1 where
a) a dielectric insulating layer is printed over the circuit traces and attached electronic devices, and
b) a shielding layer is printed over the dielectric layer and connected to a ground plane.

20. An electronic package structure comprising:
a molded substrate having first and second opposing surfaces, and a plurality of electronic devices disposed on one of the said surfaces:
said molded substrate having a plurality of molded pockets on one of said opposing surfaces into which a plurality of said electronic devices are supported in said pocket;
wherein said electronic device is connected via copper traces formed using Build Up Technology on the surface of said molded substrate and exposed surface of the electronic device contained in the molded pocket.

21. An electronic package structure comprising:
a molded substrate having first and second opposing surfaces, and electronic devices disposed on both of the said surfaces:
said molded substrate having molded pockets on both of said opposing surfaces into which said electronic devices are supported in said pockets;
wherein said electronic devices are connected via copper traces formed using Build Up Technology on the surfaces of said molded substrate and exposed surface of the electronic device contained in the molded pocket.

22. An electronic package structure comprising:
a molded substrate having first and second opposing surfaces, and a plurality of bare die disposed on one of the said surfaces:
said molded substrate having a plurality of molded pockets on one of said opposing surfaces into which said bare die are supported in said pockets;
wherein said bare die are connected via copper traces formed using Build Up Technology on the surface of said molded substrate and exposed surfaces of the bare die contained in the molded pockets.

23. An electronic package structure comprising:
a molded substrate having first and second opposing surfaces, and a plurality of bare die disposed on both of the said surfaces:
said molded substrate having a plurality of molded pockets on both of said opposing surfaces into which said bare die are supported in said pockets;
wherein said bare die are connected via copper traces formed using Build Up Technology on the surface of said molded substrate and exposed surfaces of the bare die contained in the molded pockets.

* * * * *